US008590902B2

(12) United States Patent
Yamada

(10) Patent No.: US 8,590,902 B2
(45) Date of Patent: Nov. 26, 2013

(54) SEAL MEMBER, DEPRESSURIZED CHAMBER, DEPRESSURIZING PROCESSING APPARATUS, SEAL MECHANISM OF DEPRESSURIZED CHAMBER, AND METHOD OF MANUFACTURING A DEPRESSURIZED CHAMBER

(75) Inventor: Youhei Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1546 days.

(21) Appl. No.: 11/740,548

(22) Filed: Apr. 26, 2007

(65) Prior Publication Data

US 2007/0257033 A1    Nov. 8, 2007

(30) Foreign Application Priority Data

Apr. 27, 2006  (JP) .................................. 2006-123876

(51) Int. Cl.
*F16J 15/02*       (2006.01)
*B65D 6/00*        (2006.01)
*B65D 8/04*        (2006.01)

(52) U.S. Cl.
USPC ........... 277/312; 220/4.33; 220/677; 277/644

(58) Field of Classification Search
USPC ........ 220/4.33, 4.28, 677, 685, 692; 277/312, 277/644, 645, 637, 630, 921, 600, 615, 616, 277/905, 641; 52/79.1; 411/52; 403/231, 403/64–71, 401, 403, 205
See application file for complete search history.

(56) References Cited

U.S. PATENT DOCUMENTS

| 3,042,158 | A | * | 7/1962 | Michaels ...................... 403/288 |
| 4,696,568 | A | * | 9/1987 | Weistra ........................ 356/28.5 |
| 5,853,176 | A | * | 12/1998 | Kiriyama ..................... 277/312 |
| 7,559,180 | B2 | * | 7/2009 | Ajiki ............................ 52/655.1 |
| 2002/0021936 | A1 | * | 2/2002 | Rae-Smith .................... 403/403 |
| 2002/0037195 | A1 | * | 3/2002 | Ajiki ............................. 403/403 |

* cited by examiner

*Primary Examiner* — Bryon Gehman
*Assistant Examiner* — Shawn Braden
(74) *Attorney, Agent, or Firm* — Oblon, Spivak, McClelland, Maier & Neustadt, L.L.P.

(57) ABSTRACT

A seal member internally seals a depressurized chamber constructed by joining a plurality of plates. The seal member includes a linear portion for sealing a linear joint of the depressurized chamber and a loop portion for sealing around a corner of the depressurized chamber by being pressed against internal walls of the plates forming the corner. The loop portion is arranged to enclose the corner of the depressurized chamber. The loop portion is fixed by using a support block held at the corner and a corner pressing member joined to the plates forming the corner. The loop portion is secured between a support surface of the support block and the corner pressing member.

19 Claims, 13 Drawing Sheets

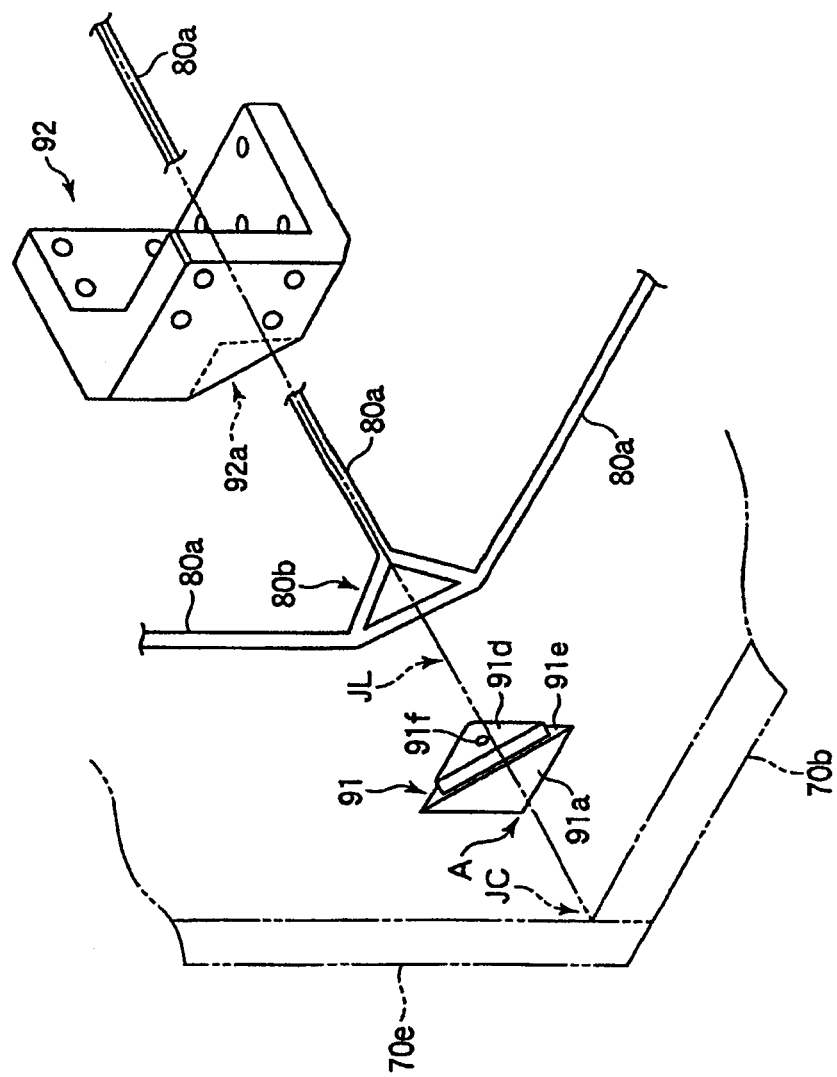

SEAL MEMBER, DEPRESSURIZED CHAMBER, DEPRESSURIZING PROCESSING APPARATUS, SEAL MECHANISM OF DEPRESSURIZED CHAMBER, AND METHOD OF MANUFACTURING A DEPRESSURIZED CHAMBER

FIELD OF THE INVENTION

The invention relates to a sealing technology of a depressurized chamber (including a vacuum chamber, both having the same meaning, hereinafter); and more particularly to a sealing technology of a depressurized chamber which is used for performing processes such as dry etching, film formation, substrate transfer, and position alignment under a depressurized environment on a glass substrate for a flat panel display (FPD) including a liquid crystal display (LCD) and plasma display panel for example.

BACKGROUND OF THE INVENTION

Conventionally, a vacuum chamber has been manufactured by machining a material block into a chamber or connecting plates by using welding or soldering, in view of ensuring a durability and an airtightness against an atmospheric pressure. However, in the case of performing a cutting process by using a machine, since a lot of material should be cut, it takes a long time for processing and a large amount of the material wastes. Further, in the method of welding or soldering, deformations caused by applied heat should be removed or a finishing processing should be performed therefor, which increases a manufacturing cost thereof.

Recently, as target substrates are scaled up, the size of a processing chamber is also increased. For example, in the manufacturing process of FPD, a large-sized glass substrate, having a rectangular shape whose long side is more than 2 m, is received in the processing chamber and the processes such as etching, ashing and film formation are performed in a vacuum state. Further, in a vacuum chamber for processing such a large-sized glass substrate in a vacuum state, a metallic chamber made of aluminum or the like is required to have a sufficient stiffness to withstand the atmospheric pressure with the inside thereof kept in a vacuum state.

Accordingly, in the integrated vacuum chamber manufactured by the conventional machining or welding, walls of the chamber should be thick sufficiently, which increases the weight thereof. Further, a large machine is needed to machine it, so that a manufacturing cost is increased. Further, if the vacuum chamber is scaled up to exceed a certain size, a legal restriction is imposed on its transportation, so that a transportation cost is increased.

As a technology of manufacturing a vacuum chamber by other method than the machining and the welding, there has been provided a vacuum chamber which uses a plurality of plates tightly joined in a box-shape by structure bolts; seal members continuously provided, along the joint lines of the adjacent plates, at the inner side thereof; and press members attached by fastening bolts, each press member pressing the seal member against the joint line to airtightly seal the joint line (see, e.g., Japanese Patent Laid-open Application No. H9-209150 (FIG. 4): Reference Document)

Since the vacuum chamber of the Reference Document includes the plates and the seal members, it is possible to assemble them at an installation place and there is a little restriction to transportation thereof. Further, the vacuum chamber can be made at a lower cost compared with the case of manufacturing a vacuum chamber by using the conventional machining or welding. However, in the vacuum chamber having a structure constructed by combining and joining plates as described in the Reference Document, it is difficult to ensure an airtightness at the corner of the chamber.

In the Reference Document, for example, a branched seal member is used where three plates are joined at the corner, wherein branches of the seal member are extended at a right angle with respect to each other in three-directions along joint lines of the plates. However, a three-dimensional mold is required to manufacture such a branched seal member, so that cost increase is inevitable.

Further, in the seal mechanism disclosed in the Reference Document, a sealing is obtained by pressing an elastomer against the joint lines of the plates with a specific force. However, it is difficult to sufficiently press the branched seal member at the corner of the vacuum chamber formed by three plates, and it may be impossible to maintain the inside of the vacuum chamber in a vacuum state.

SUMMARY OF THE INVENTION

It is, therefore, an object of the present invention to provide a seal member capable of ensuring sufficient airtightness at corners in a vacuum chamber constructed by joining a plurality of plates.

In accordance with a fist aspect of the present invention, there is provided a seal member for internally sealing a depressurized chamber, including a loop portion for sealing around a corner of the depressurized chamber, the loop portion being arranged to enclose the corner of the depressurized chamber and pressed against internal walls of a plurality of plates forming the corner.

Further, in accordance with a second aspect of the present invention, there is provided a seal member for internally sealing joints of a depressurized chamber constructed by joining a plurality of plates, including a linear portion for sealing a linear joint of the depressurized chamber; and a loop portion for sealing around a corner of the depressurized chamber, the loop portion being arranged adjacent to the linear portion to enclose the corner joint of the depressurized chamber and pressed internal walls of the plates forming the corner.

It is preferable that the linear portion is connected to the loop portion near the corner of the depressurized chamber in a seal state. In this case, it is also preferable that the loop portion is arranged to form an obtuse angle with the adjacent linear portion in a seal state. Further, the linear portion and the loop portion may be integrally connected to each other.

Further, it is preferable that the loop portion is arranged to form an obtuse angle with the joint line formed by the plates forming the corner in a sealing state. Further, the loop portion may be formed in a circular ring shape or a polygonal shape. Further, the loop-shaped portion may be fixed by a support block held at the corner of the depressurized chamber, the support block having a support surface to support the loop portion; and a corner pressing member joined to the plates forming the corner of the depressurized chamber, the corner pressing member securing the loop portion between the support surface of the support block and the corner pressing member.

In accordance with a third aspect of the present invention, there is provided a seal member for internally sealing joints of a depressurized chamber constructed by joining a plurality of plates, includes a linear portion arranged along a joint line formed by the plates is bent at an obtuse angle near a corner of the depressurized chamber and connected with another linear portion arranged along another joint line at a position spaced apart from the corner.

It is preferable that the linear portion arranged along the one joint line is branched at the bent position into two parts which are connected to two linear portions arranged along other two joint lines converged into the corner, respectively. In this case, the branched parts may be arranged to enclose the corner of the depressurized chamber and pressed to internal walls of the plates forming the corner by an assistance mechanism.

In accordance with a fourth aspect of the present invention, there is provided a depressurized chamber constructed by joining a plurality of plates, wherein the depressurized chamber is internally sealed by a seal mechanism, the seal mechanism includes a seal member having a linear portion for sealing a linear joint formed by the plates, and a loop portion being arranged adjacent to the linear portion to enclose a corner of the depressurized chamber for sealing around the corner of the depressurized chamber by being pressed against internal walls of the plates forming the corner; a linear part pressing member for fixing the linear portion of the seal member; a support block held at the corner of the depressurized chamber, the support block having a support surface to support the loop portion of the seal member; and a corner pressing member joined to the plates forming the corner of the depressurized chamber, the loop portion being secured between the support surface of the support block and the corner pressing member.

It is preferable that the support block may have a protruded contact surface which comes in contact with the corner pressing member, the support surface being formed around the contact surface. It is also preferable that the corner pressing member may have a protruded contact surface which comes in contact with the support block, and a pressing surface for pressing the loop portion formed around the contact surface.

Further, the support block may be fixed to the plates forming the corner. Further, the corner pressing member may be fixed to the plate forming the corner. Further, the corner pressing member may have a press surface for pressing the linear portion against the joint line formed by the plates forming the corner. Further, the support block and the corner pressing member may be connected with each other.

In accordance with a fifth aspect of the present invention, there is provided that a depressurizing processing equipment comprising a depressurized chamber according to a fourth aspect of the present invention.

In accordance with a sixth aspect of the present invention, there is provided a seal mechanism of a depressurized chamber for internally sealing the depressurized chamber constructed by joining a plurality of plates, including a seal member having a linear portion for sealing a linear joint formed by the plates, and a loop portion disposed adjacent to the linear portion, the loop portion being arranged to enclose a corner of the depressurized chamber and sealing around the corner of the depressurized chamber by being pressed against internal walls of the plates which form the corner; a linear part pressing member for fixing the linear portion of the seal member; a support block held at the corner of the depressurized chamber, the support block having a support surface to support the loop portion of the seal member; and a corner pressing member joined to the plates forming the corner of the depressurized chamber, the loop portion being fixed between the support surface of the support block and the corner pressing member.

In accordance with a seventh aspect of the present invention, there is provided a method of manufacturing a depressurized chamber, including steps of assembling a housing by joining a plurality of plates; and providing a seal member having a linear portion for sealing a linear joint formed by the plates and a loop portion arranged adjacent to the linear portion, sealing the linear joint formed by the plates by using the linear portion and sealing around a corner formed by the plates by using the loop portion in the housing.

It is preferable that the around of the corner is sealed by pressing the loop portion against internal walls of the plates forming the corner. Further, it is also preferred that the loop portion is arranged to form an obtuse angle with the adjacent linear portion. Further, it is preferred that the loop portion is arranged to form an obtuse angle with the joint line formed by the plates forming the corner.

Further, it is preferable that the loop portion is fixed by using a support block held at the corner of the depressurized chamber, the support block having a support surface to support the loop portion, and a corner pressing member joined to the plates forming the corner of the depressurized chamber, the loop portion being secured between the support surface of the support block and the corner pressing member. Further, it is preferable that the seal member is formed by integrally connecting the linear portion and the loop portion.

The seal member of the present invention is arranged to enclose corners of a depressurized chamber and configured as a loop-shaped portion to seal around the corners by pressing the loop-shaped portion to three plates forming the corners. Therefore, the corners can be tightly sealed without bending the seal member at angles less than or equal to 90 degree. By using seal members with a high seal quality at the corners, it is possible to remarkably enhance the airtightness in the depressurized chamber with an assembly structure that a plurality of plates is joined.

Accordingly, by using the seal member of the present invention, the depressurized chamber having a configuration which ensures high quality of sealing can be manufactured. Therefore, a large-scaled depressurized chamber, which is difficult to be manufactured by the conventional joining method such as the mechanical processing or welding, can be manufactured.

BRIEF DESCRIPTION OF THE DRAWINGS

The above and other objects and features of the present invention will become apparent from the following description of embodiments given in conjunction with the accompanying drawings, in which:

FIG. 10 illustrates a view provided to describe the seal mechanism in a corner;

DETAILED DESCRIPTION OF THE EMBODIMENTS

Figure 1:
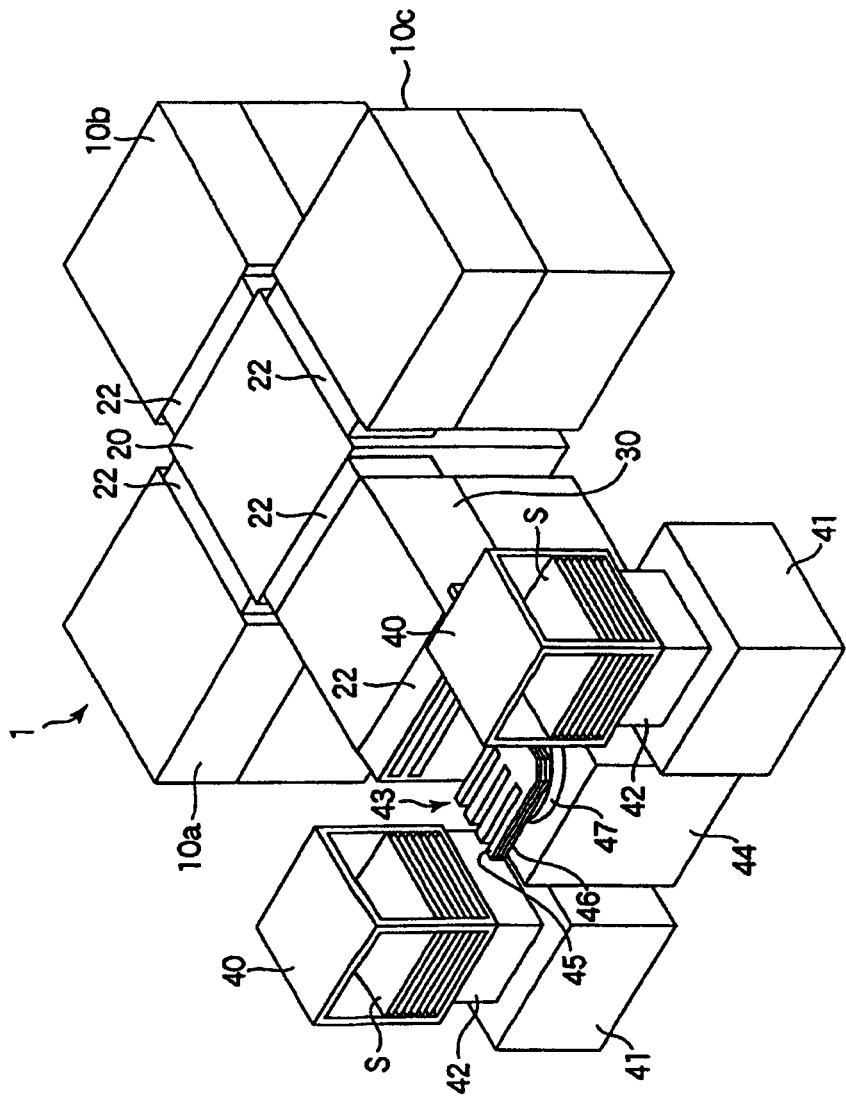
FIG. 1 is a perspective view schematically illustrating a vacuum processing system to which a seal mechanism of the present invention can be applied.
Figure 2:
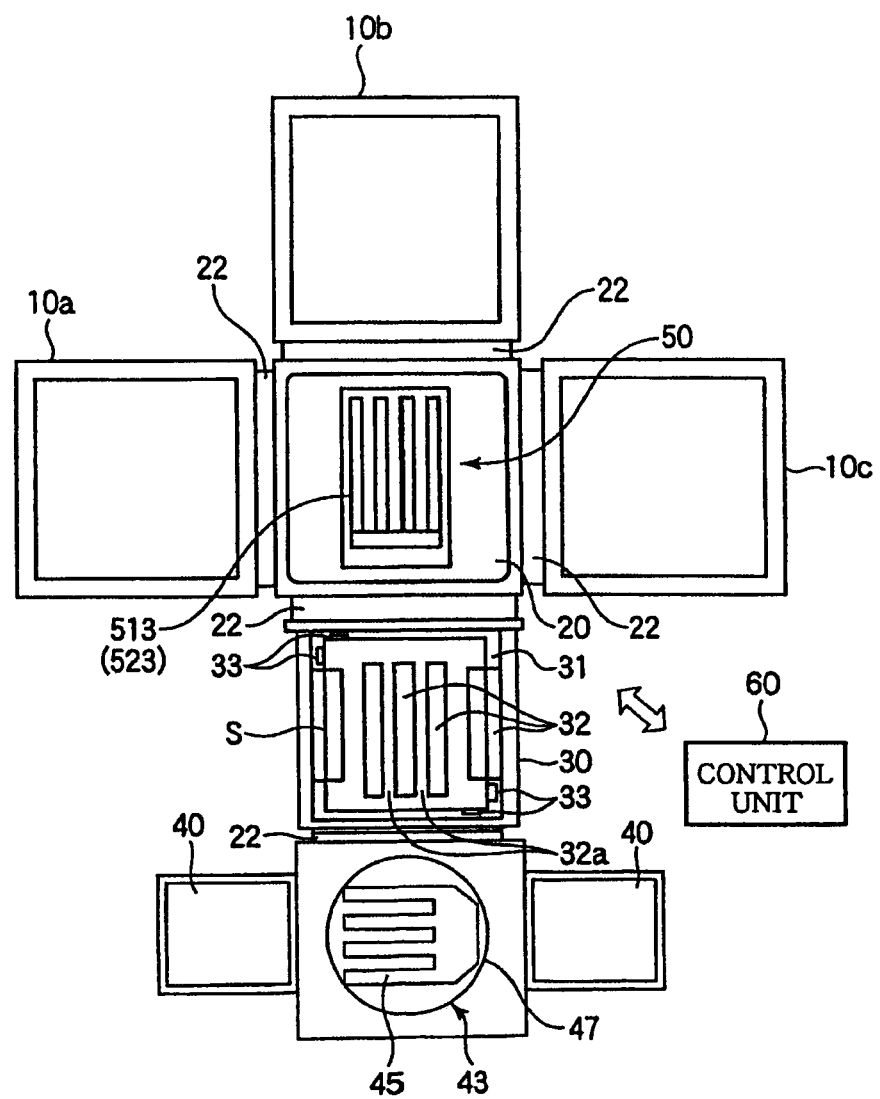
FIG. 2 is a horizontal sectional view of the vacuum processing system shown in FIG. 1.

Hereinafter, embodiments of the present invention will be described with reference to the accompanying drawings. Herein, a vacuum processing system to which a seal mechanism of the present invention can be applied will be described as an example. FIG. 1 is a perspective view schematically illustrating a vacuum processing system 1 having a vacuum chamber in accordance with a first embodiment of the present invention, and FIG. 2 is a horizontal sectional view schematically illustrating the inside of the vacuum processing system.

The vacuum processing system 1 is configured as a vacuum processing system of a multiple chamber type for performing a plasma processing on a glass substrate S for FPD (hereinafter, simply referred to as a substrate) for example. Here, the FPD may be a liquid crystal display (LCD), a light emitting diode (LED) display, an electro luminescence (EL) display, a vacuum fluorescence display (VFD), and a plasma display panel (PDP), for example.

A transfer chamber 20 and a load-lock chamber 30 are installed in the center portion of the vacuum processing system 1, being connected each other. Further, three processing chambers 10a, 10b and 10c for performing a plasma processing such as etching on the substrate S are placed around the transfer chamber 20. The transfer chamber 20, the load-lock chamber 30 and three processing chambers 10a, 10b and 10c are all configured as vacuum chambers.

Gate valves 22 are respectively interposed between the transfer chamber 20 and the load-lock chamber 30, between the transfer chamber 20 and each of the processing chambers 10a, 10b and 10c, and at an opening portion allowing the load-lock chamber 30 to communicate with the exterior atmosphere, wherein the gate valves airtightly seal between them and are constructed to be openable/closable.

Two cassette indexers 41 are provided outside of the load-lock chamber 30, and cassettes 40 for receiving substrate S are respectively mounted thereon. One of these cassettes 40 may accommodate substrates to be processed, for example, and the other may contain processed substrates. These cassettes 40 can be moved up and down by an elevator 42.

A transfer unit 43 is provided on a support 44 between these two cassettes 40. The transfer unit 43 includes upper and lower picks 45 and 46, and a base 47 for moving them forward and backward and rotating them.

Insides of the processing chambers 10a, 10b and 10c can be maintained in a depressurized atmosphere, for example in a vacuum state, and a plasma processing, e.g., an etching or an ashing, is performed therein. There are provided three processing chambers in this embodiment. Two processing chambers may be configured as etching process chambers and the remaining one may be configured as an ashing process chamber. Otherwise, three processing chambers may be configured for performing a same processing, that is, as etching process chambers or ashing process chambers. Further, the number of the processing chambers may be four or more, without being limited to three.

The transfer chamber 20 can be maintained in the same depressurized atmosphere as those in the processing chambers 10a, 10b and 10c which are vacuum processing chambers. A transfer device 50 including upper and lower slide picks 513 and 523 (only the upper one is shown), is placed in the transfer chamber 20, as shown in FIG. 2. Further, the substrate S is transferred between the load-lock chamber 30 and three processing chambers 10a, 10b and 10c by the transfer device 50.

The load-lock chamber 30 can be maintained in the same depressurized atmosphere as those in the processing chambers 10a, 10b, 10c and the transfer chamber 20. Further, the load-lock chamber 30 is used for transferring the substrate S between the cassette 40 of an atmospheric ambiance and the processing chambers 10a, 10b and 10c of the depressurized atmosphere, so that the inside of the load-lock chamber 30 alternates between the air atmospheric ambiance and the depressurized atmosphere. Therefore, inside volume of the load-lock chamber 30 is preferably made as small as possible.

The load-lock chamber 30 is provided with upper and lower substrate receiving units 31 (only the upper one is shown in FIG. 2). Each substrate receiving unit 31 has a plurality of buffers 32 for supporting the substrate S, and a clearance groove 32a for the slide picks 513 and 523 is formed therebetween. Further, the load-lock chamber 30 has positioners 33, which aligns a rectangular-shaped substrate S by contacting with the areas of the rectangular-shaped substrate S near the diagonally opposite corners thereof.

Figure 3:
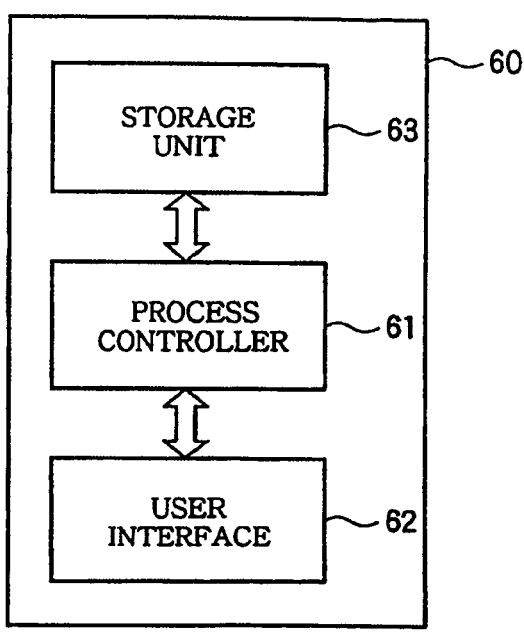
FIG. 3 is a block diagram schematically describing a controller.

Each component of the vacuum processing system 1 is connected to a controller 60 to be controlled thereby (not shown in FIG. 1). A schematic diagram of the controller 60 is shown in FIG. 3. The controller 60 has a process controller 61 including a CPU. The process controller 61 is connected to a user interface 62 including a key board and a display device. An operator can input a command for managing the vacuum processing system 1 through the key board and the display device visualizes and displays an operational status of the vacuum processing system 1.

Further, the controller 60 has a storage unit 63 storing therein recipes including process condition data and control programs (software) for realizing various processes to be performed in the vacuum processing system 1 under the control of the process controller 61. Further, the storage unit 63 is connected to the process controller 61.

In case of necessity, the vacuum processing system 1 performs a desired process under the control of the process controller 61, by reading recipe from the storage unit 63 and executing it in accordance with an instruction from the user interface 62.

The recipe such as the control program or the process condition data may be retrieved from a computer readable storage medium, e.g., CD-ROM, hard disc, flexible disc and flash memory, or retrieved on-line through, for example, a dedicated line from another device at any time.

Next, a description will be given for an operation of the vacuum processing system 1 constructed as described above. First of all, two pieces of picks 45 and 46 of the transfer device 43 are driven to move back and forth, and two sheets of substrate S are respectively carried into the upper and lower substrate receiving units 31 of the load-lock chamber 30 from one cassette 40 accommodating substrates to be processed.

After the picks 45 and 46 are retreated, the gate valve 22 at the atmospheric side of the load-lock chamber 30 is closed.

Thereafter, the load-lock chamber 30 is exhausted to be depressurized to a predetermined vacuum level. After completing the vacuum exhausting, the substrate S is arranged by being pressed by the positioner 33.

After the substrate S is arranged as described above, the gate valve 22 between the transfer chamber 20 and the load-lock chamber 30 is opened and the substrate S in the substrate receiving unit 31 is received by the transfer device 50 in the transfer chamber 20. Further, the substrate S is transferred to any one of the processing chambers 10a, 10b and 10c by the slide pick 513 or 523 of the transfer device 50.

The substrate S, on which a desired processing such as etching has been performed in the processing chambers 10a, 10b and 10c, is taken out of the processing chambers 10a, 10b and 10c by the transfer device 50. Further, the substrate S is received in the cassette 40 by the transfer device 43 via the load-lock chamber 30 in the reverse way to the above. At this time, the substrate S may be returned to the original cassette 40 or be received in the other cassette 40.

Hereinafter, a description will be given for a seal member of the present invention and a seal mechanism using same. The vacuum chambers such as the transfer chamber 20, the load-lock chamber 30 and the processing chambers 10a, 10b and 10c are sealed by using seal members to maintain the insides thereof in a vacuum state. Here, a seal mechanism in the transfer chamber 20 will be described, for example.

Figure 4:
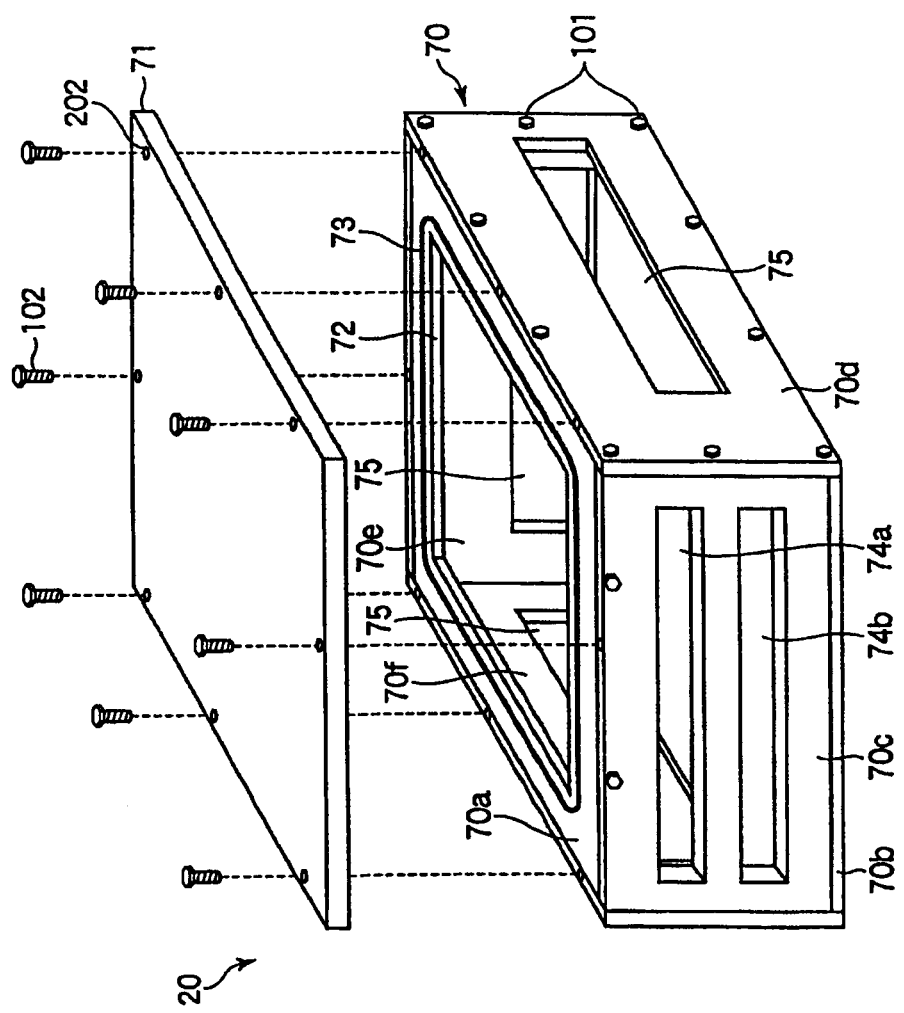
FIG. 4 is a perspective view illustrating an external configuration of a transfer chamber.
Figure 5:
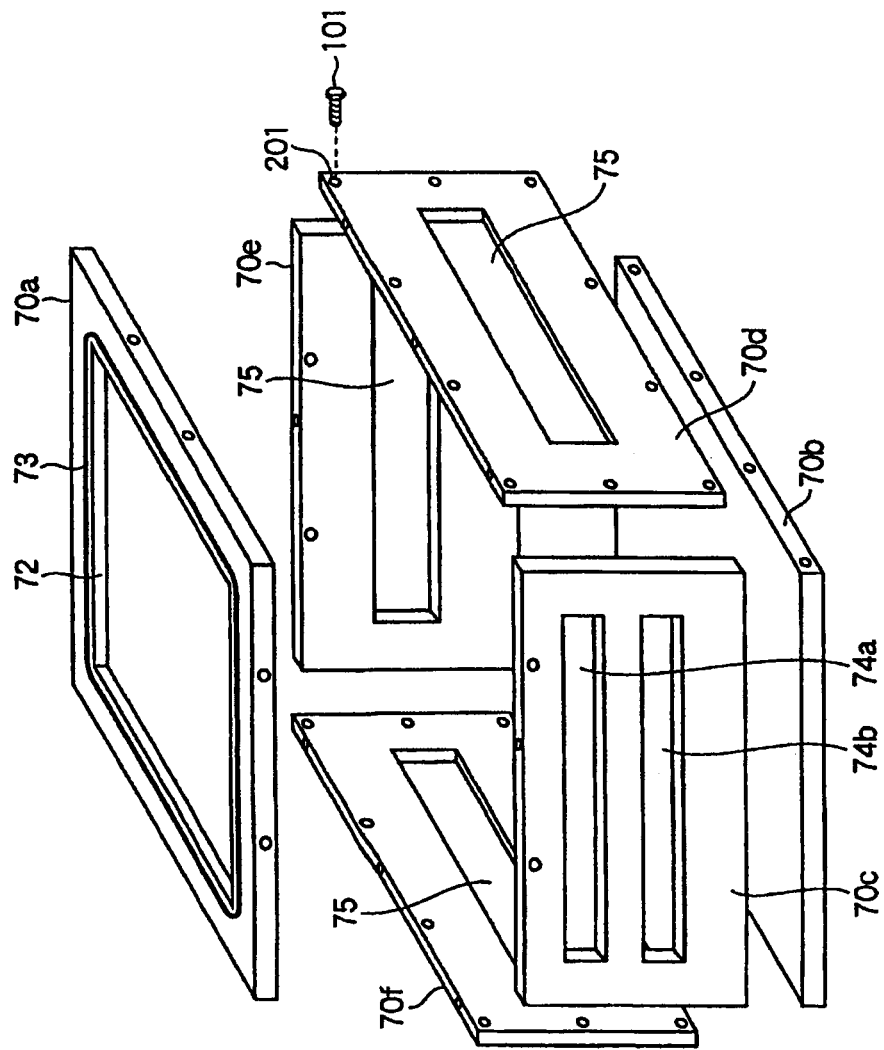
FIG. 5 is an exploded perspective view of a housing.

FIG. 4 is a perspective view illustrating an external appearance of the transfer chamber 20, and FIG. 5 is an exploded perspective view thereof. Further, the internal components such as the transfer device 50 and the like are not shown in FIGS. 4 and 5.

The transfer chamber 20 is a vacuum chamber having a housing 70 and a ceiling plate 71 as main components. The housing 70 is constructed by joining six plates together. That is, the housing 70 includes an upper plate 70a, a bottom plate 70b which is arranged opposite and parallel to the upper plate 70a, and four side plates 70c, 70d, 70e and 70f which are joined to the upper plate 70a and the bottom plate 70b. The plates of the housing 70 are assembled by fixing units 101 such as screws or bolts to define a transfer space for transferring the substrate S therein.

The upper plate 70a has an opening 72 in its center as shown in the figures. In the state that the ceiling plate 71 is lifted by using, e.g., a crane, maintenance or the like of the transfer device 50 installed in the transfer chamber 20 can be carried out through the opening 72. Further, a seal member 73 such as an O ring is provided in a fine groove (not shown), around the opening 72 of the upper plate 70a. By depressurizing the interior of the transfer chamber 20 while the ceiling plate 71 is provisionally fixed to the housing 70 by using fixing units such as screws or bolts, it is possible to provide a sufficient sealing to allow the transfer chamber 20 to serve as a vacuum chamber.

Although not shown, an opening for installing the transfer device 50 (see FIG. 2) is also formed in the bottom plate 70b. Further, reference numerals 201 and 202 denote screw holes through which the fixing units 101 and 102 are inserted to fix the plates together.

Transfer openings, through which the substrate S is transferred into and from the transfer chamber 20, are formed in the respective four side plates 70c, 70d, 70e and 70f. The transfer openings 74a and 74b formed in the short side plate 70c of the housing 70 are located so that the substrate S can be transferred between the transfer chamber 20 and the buffer 32 of the load-lock chamber 30 (see FIGS. 1 and 2). Further, the transfer openings 75, formed in the other side plates 70d to 70f of the housing 70, are used in transferring the substrate S to and from processing chambers 10a to 10c as the vacuum processing chambers, respectively.

The gate valve 22 is installed in each of the transfer openings 74a, 74b and 75 described above (referring to FIG. 1). The substrate S is transferred between each of the processing chambers 10a, 10b and 10c and the load-lock chamber 30 which are disposed adjacent to each other via the gate valve 22.

The ceiling plate 71 and the six plates of the housing 70 of the transfer chamber 20 can be made of a metal material such as aluminum, stainless steel or the like.

The transfer chamber 20 can be assembled in the following sequence. First, the upper plate 70a, the bottom plate 70b and the side plates 70c to 70f are joined by the fixing units 101 such as screws or bolts to form the housing 70. At this time, the plates may be assembled in any order. Next, joints of the plates are internally sealed in the housing 70 by the seal mechanism in accordance with the first embodiment of the present invention to ensure a sufficient airtightness to withstand in the vacuum state. The seal mechanism will be described later.

Next, after the internal components such as the transfer device 50 and the like and the gate valve 22 are installed in the housing 70, the ceiling plate 71 is positioned on the upper part of the housing 70 and the seal member 73 such as an O ring is brought into contact with the bottom surface of the ceiling plate 71. Then, the ceiling plate 71 is provisionally fixed to the housing 70 by using the fixing units 102 such as screws and bolts. In this case, the seal member 73 is pressed against the bottom side of the ceiling plate 71 by exhausting the inside of the transfer chamber 20 by using a gas exhausting unit (not shown). As a result, the inside of the transfer chamber 20 can be maintained in a vacuum state with ensuring an airtightness.

Further, when the ceiling plate 71 and the plates (the upper plate 70a, the bottom plate 70b and the side plates 70c to 70f) of the housing 70 are joined, any fixing unit may be employed without being limited to the screw and the bolt.

Figure 6:
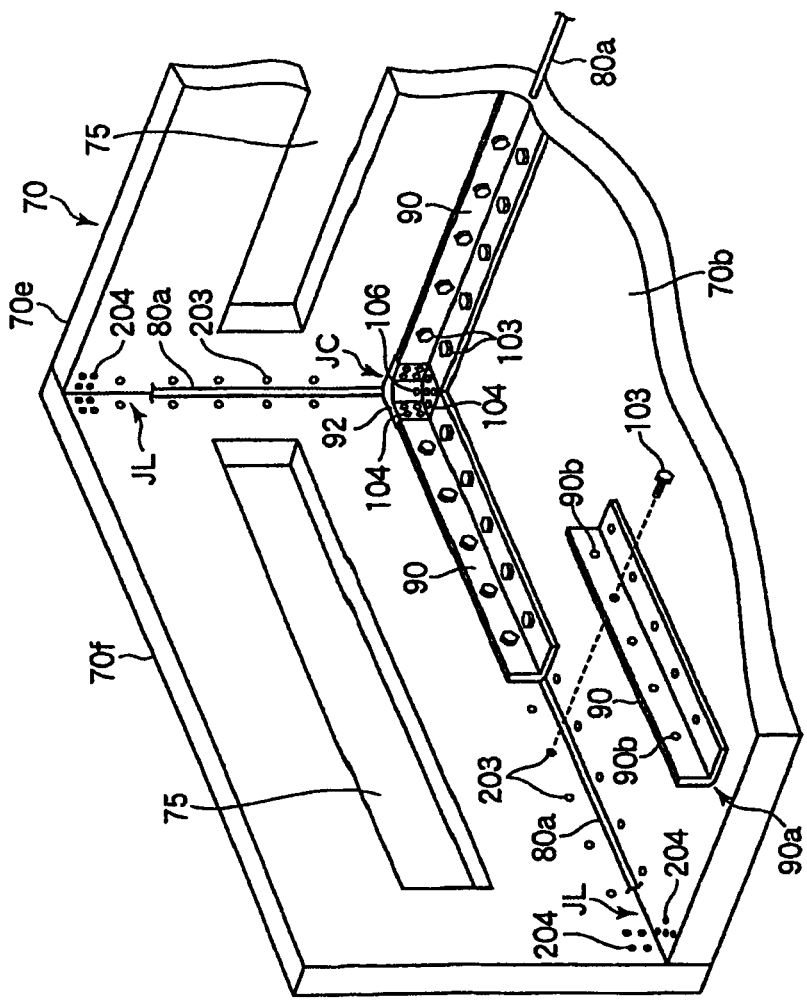
FIG. 6 is a perspective view showing major parts of a joining structure in the housing.
Figure 7:
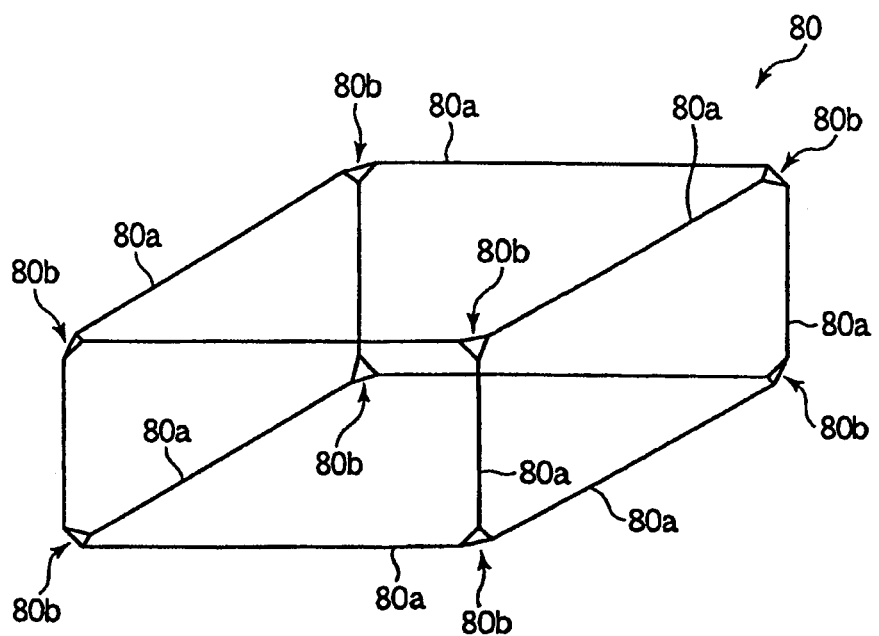
FIG. 7 is a perspective view illustrating an entire shape of a seal member.
Figure 8:
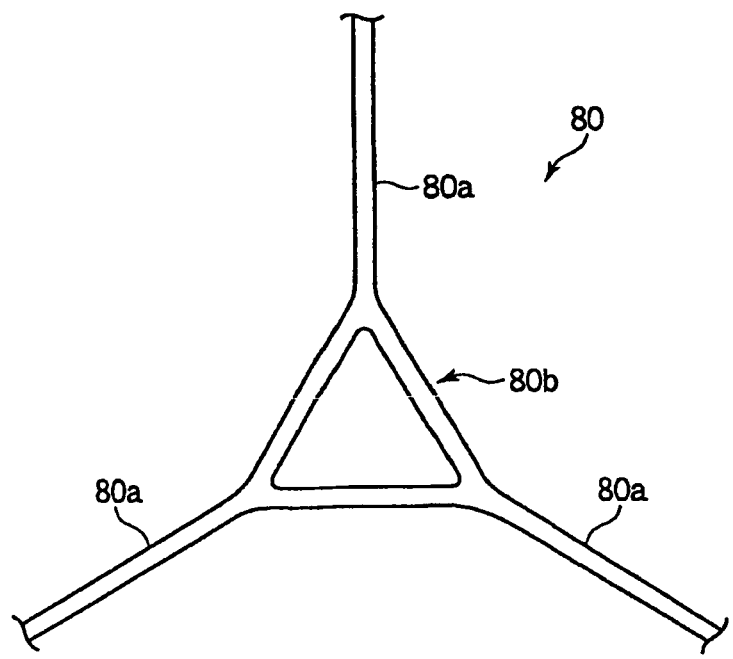
FIG. 8 depicts an enlarged view of a loop portion of the seal member.

FIG. 6 is a perspective view illustrating major parts of the seal mechanism at the joints in the transfer chamber 20. Further, FIG. 7 is a perspective view illustrating an entire configuration of a seal member 80 used in the present embodiment, and FIG. 8 is an enlarged view of major parts thereof.

The seal mechanism in accordance with the present embodiment uses the seal member 80 having a corresponding shape to the internal joints of the housing 70, and an assistance mechanism for fixing the seal member 80 (a linear part pressing member 90, a support block 91 and a corner part pressing member 92 to be described later).

The internal joints of the housing 70 include a linear joint JL formed by two plates, and a three-dimensional joint JC formed by three plates at the corners of the housing 70.

As the joint JL, there are provided a joint JL of the bottom plate 70b and the side plate 70f in FIG. 6 and a joint JL of the side plates 70e and 70f in FIG. 6, for example. In this case, each joint JL has a linear joint line. As the joint JC, there is provided a joint JC of the bottom plate 70b, and the side plates 70e and 70f formed at the corner of the housing 70 in FIG. 6, for example. In this case, three joint lines intersect perpendicularly to each other at the corner of the housing 70. Further, while only the joints of the three plates (the bottom plate 70b, the side plates 70e and 70f) are represented in FIG. 6, joints of the other plates of the housing 70 are also formed as the joint JL and the joint JC.

Accordingly, in the present embodiment, as shown in FIG. 7, the seal member 80 has a linear portion 80a and a loop portion 80b. The linear portion 80a in FIG. 7 is prepared correspondingly to the interior joint line of the linear joint JL of the plates (the upper plate 70a, the bottom plate 70b and the side plates 70c to 70f) of the housing 70. Further, the eight loop portions 80b are prepared correspondingly to the eight corners (joints JC) of the housing 70.

In the state that the housing 70 is sealed, the linear portion 80a arranged along one joint line of the linear joint JL is bent near the corner of the housing 70 at an obtuse angle, e.g., 120 to 150 degrees to be connected with another linear portion 80a arranged along another joint line of the linear joint JL at a position slightly apart from the corner.

Specifically, the linear portion 80a divided into two, at the bent part, which are respectively connected to two linear portions 80a arranged along other two joint lines converged into the corner to form the loop portion 80b.

The seal member 80 is made of a string-shaped elastomer having a diameter of 2 to 10 mm, for example.

Material of the seal member 80 may be an elastomer such as fluorine-based rubber, butyl-based rubber or silicon, e.g., Viton (trademark; made by DuPont company), for example, as similarly to the conventional O ring.

Figure 9:
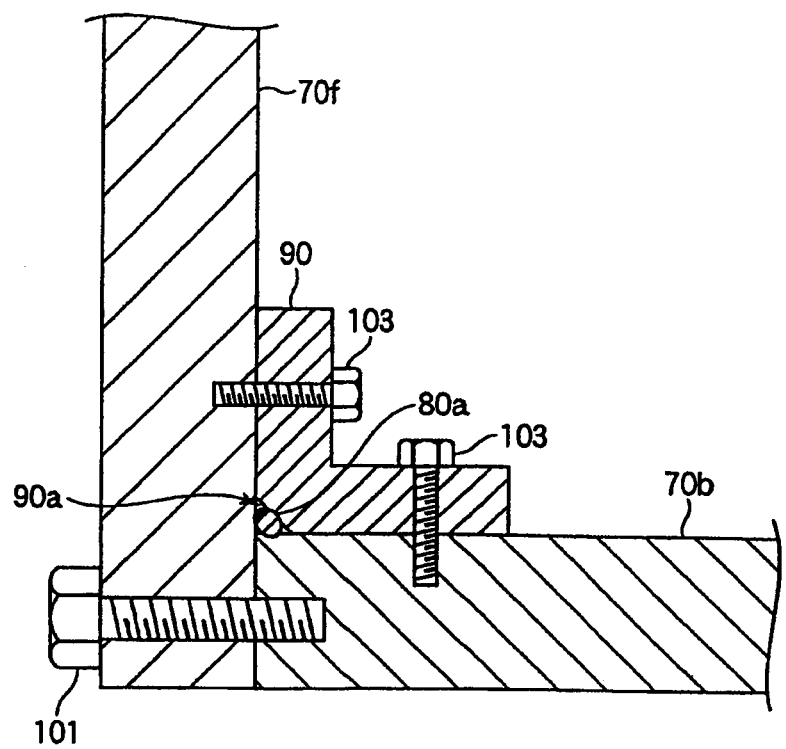
FIG. 9 shows a cross sectional view of major parts of the seal mechanism at a linear joint.

As shown in FIG. 6, the linear joint JL formed by two plates is sealed by the linear portion 80a. The linear portion 80a is arranged along the joint line of the joint JL formed by, e.g., the bottom plate 70b and the side plate 70f, and fixed by the assistance mechanism. Specifically, as shown in FIG. 9 for example, the linear portion 80a is fixed to the joint line with being pressed against the joint line by the linear part pressing member 90 having a L-shaped cross section.

Here, the outside corner of the linear part pressing member 90 having the L-shaped cross section is chamfered to have a flat pressing surface 90a linearly formed to contact and firmly press the linear portion 80a of the seal member 80. While pressing the linear portion 80a against the internal joint line of the housing 70 by the pressing surface 90a, the linear part pressing member 90 is fixed to the internal surface of the housing 70 by using fixing units 103 such as screws or bolts. In this way, the linear joint JL of the housing 70 can be positively sealed.

Further, although not shown in FIG. 6, the linear part pressing member 90 is also placed at the joint JL of the side plates 70e and 70f. Further, reference numeral 203 in FIG. 6 represents screw holes used to fix the linear part pressing member 90 with the fixing units 103 such as screws or bolts, and reference numeral 90b represents holes in the linear part pressing member 90 into which the fixing units 103 are respectively fitted.

As described above, at the corner of the housing 70, the airtightness of the joint JC is ensured by the loop portion 80b. At this time, the support block 91 fixed to the corner of the housing 70 to support the loop portion 80b and the corner pressing member 92 for fixing the loop portion 80b between the corner pressing member 92 and the support block 91 are used as the assistance mechanism for fixing the loop portion 80b as shown in FIG. 10. Further, reference numeral 204 in FIG. 6 represents screw holes used to fix the corner pressing member 92 by using fixing units 104 such as screws or bolts.

Figure 11A:
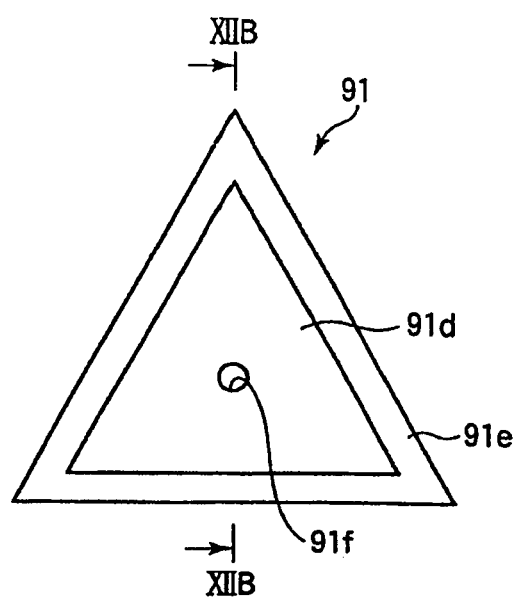
FIG. 11A is a front view of a support block and FIG. 11B is a sectional view thereof taken along the line XIIB-XIIB in FIG. 11A.
Figure 11B:
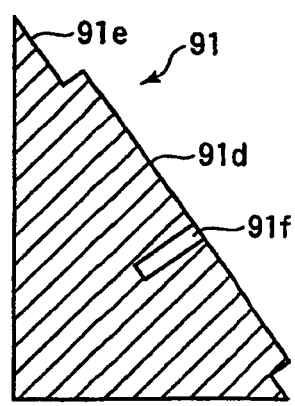

As shown in FIGS. 10, 11A and 11B, the support block 91 has a trigonal pyramid shape which is nearly a regular tetrahedron, and three contact surfaces 91a, 91b and 91c respectively contacting with three plates forming the corner of the housing 70 (only the contact surface 91a is shown in FIG. 10). Further, one angled portion "A" forming a vertex of the trigonal pyramid is arranged to be fitted into the corner of the housing 70 forming the joint JC.

The support block 91 is fixed to the three plates forming the joint JC (for example, the bottom plate 70b and the side plates 70e and 70f in FIG. 6) by using any fixing unit.

Further, the support block 91 is provided with a triangular projection part 91d which comes to contact with the corner pressing member 92. A support surface 91e for supporting the loop member 80b is formed around the projection part 91d in a corresponding size to the triangular loop portion 80b. Further, the loop portion 80b is installed by inserting the projection part 91d into the inner edge thereof.

Figure 12A:
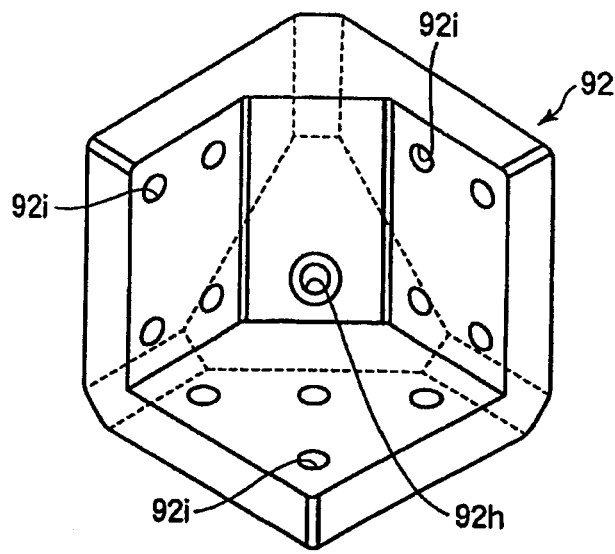
FIGS. 12A and 12B are a front view and a rear view of a corner pressing member, respectively.
Figure 12B:
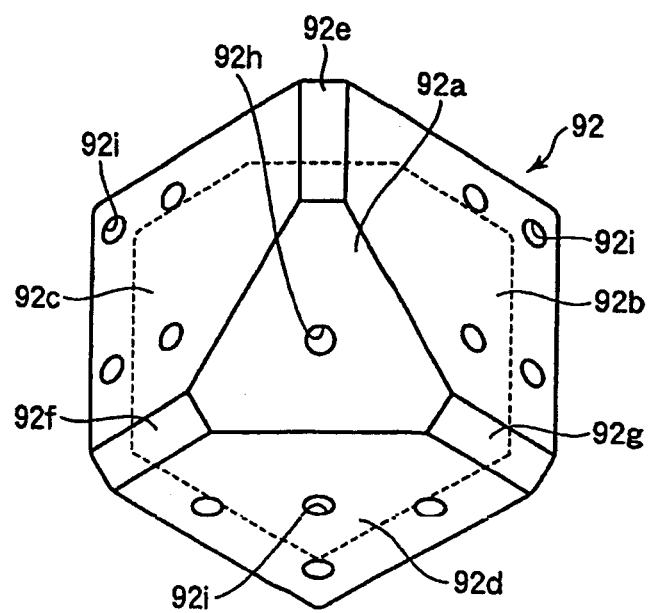

An external appearance of the corner pressing member 92 is shown in FIGS. 12A and 12B. The corner pressing member 92 has a cube shape whose one corner is cut off. The corner pressing member 92 has a contact surface 92a which comes in contact with the projection part 91d of the support block 91 to press and fix the support block 91.

Further, although not shown in the figures, the projection part 91d of the support block 91 may be flat without being protruded. Alternatively, the contact surface 92a of the corner pressing member 92 may be protruded, and a pressing surface for fixing the loop portion 80b may be formed therearound.

The corner pressing member 92 further includes contact surfaces 92b to 92d which comes in contact with the respective three plates forming the corner of the housing 70. Further, the contact surfaces 92b to 92d of the corner pressing member 92 are respectively fixed to the walls near the corner formed by the three plates by using fixing units such as screws or bolts, for example.

Further, the corner pressing member 92 has a through-hole 92h, and is fixed to the support block 91 in alignment therewith by a fixing unit 106 such as a screw fitted through the through-hole 92h into a hole 91f of the support block 91. That is, the through-hole 92h and the hole 91f have a positioning function to align the support block 91 and the corner pressing member 92. Further, reference numeral 92i denotes holes used for fixing the corner pressing member 92 by using the fixing units 104.

The assistance mechanism (the linear part pressing member 90, the support block 91 and the corner pressing member 92) can be made of a metal material such as aluminum, stainless steel or the like as similarly to the ceiling plate 71 and the six plates of the housing 70. Further, the linear part pressing member 90 and the corner pressing member 92 have a function to reinforce the joining structure of the plates of the housing 70, in addition to the sealing function by pressing and fixing the seal member 80 against the joint line.

Figure 13:
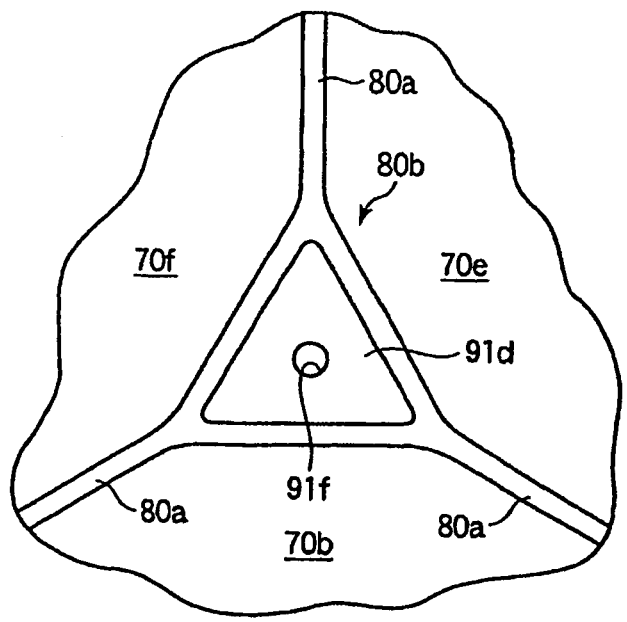
FIG. 13 depicts a view illustrating a state that the loop portion is supported by the support block.

FIG. 13 illustrates a state that the support block 91 and the seal member 80 are arranged at the corner of the housing 70. As shown in FIG. 13, the loop portion 80b is arranged such that sides of the triangular loop are in contact with the respective internal walls of the three plates (for example, the bottom plate 70b and the side plates 70e and 70f) forming the corner.

In other words, the loop portion 80b comes in contact with the internal wall of each plate around the joint JC near the corner of the housing 70, by being supported by the support block 91. Further, the loop portion 80b is fixed to the internal walls of three plates forming the joint JC, while being pressed by the support surface 91e and the corner pressing member 92. As a result, it is possible to seal around the joint JC.

Figure 14:
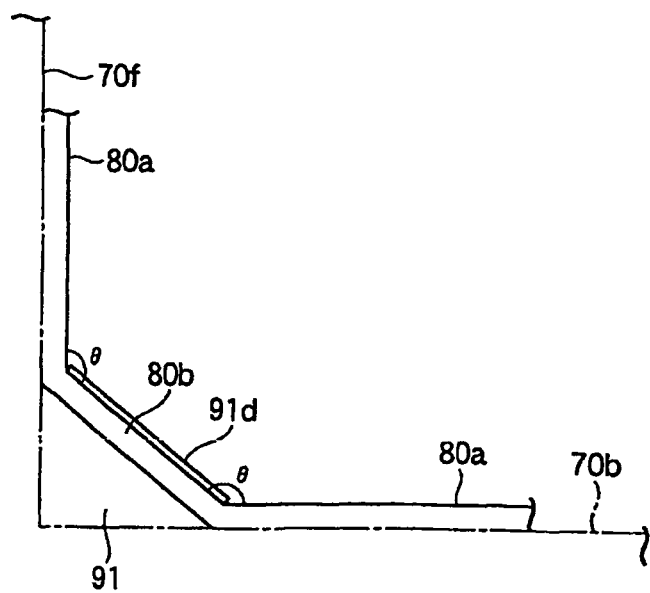
FIG. 14 is a schematic view illustrating a state that the linear portion and the loop portion are arranged in a seal state.

Further, three linear portions 80a provided at a right angle with respect to each other, are connected to the loop portion 80b around the corner of the housing 70 in the seal state. Further, as schematically shown in FIG. 14, the support block 91 supports the loop portion 80b so as to form an obtuse angle θ, e.g., 120 to 150 degree, between the linear portion 80a and the loop portion 80b in the seal state.

The angle θ is also an angle formed between the support surface 91e of the support block 91 and the joint line of the housing 70 sealed by the linear portion 80a. Accordingly, the loop portion 80b supported by the support block 91 is arranged at an angle more than 90 degree with respect to each of the three joint lines formed by three plates which define the corner.

If the seal member is directly arranged at the corner of the housing 70 as in the conventional art described before, a seal member having three branches should be used and it is impossible to seal the joint JC of the corner without bending the seal members at a right angle, for example. However, it is not easy to press the bent seal member against the joint line with a sufficient pressure, so that there may occur a leakage at the joint JC of the corner due to a poor seal thereof, which results in a deterioration in a reliability of the vacuum chamber.

For this reason, in the present embodiment of the present invention, the loop portion 80b is provided to the seal member 80 and the support block 91 is installed. By doing so, it is possible to seal the joint JC of the corner by making the loop portion 80b come in the contact with the plates around the corner, without directly sealing the joint JC of the corner.

Further, it is possible to form an obtuse angle greater than 90° between the loop portion 80b and the linear portion 80a by supporting the loop portion 80b of the seal member 80 with the support block 91. Accordingly, there hardly occurs a deterioration of sealing attributable to the seal member 80 and it is possible to ensure a sufficient sealing required to the vacuum chamber.

Further, by employing the above seal mechanism, it becomes easy to manufacture a vacuum chamber having an excellent airtightness, even in case of the vacuum chamber being assembled by joining plates. The vacuum chamber, which is assembled at the installation site, can reduce a transportation cost as well as a manufacturing cost such as a material cost and a processing cost, compared with the conventional integrated vacuum chamber.

Further, the present invention is not limited to the embodiment as described above but it may be modified in various ways. For example, the object to be processed is not limited to a glass substrate for FPD, but it may be a semiconductor wafer.

Figure 15:
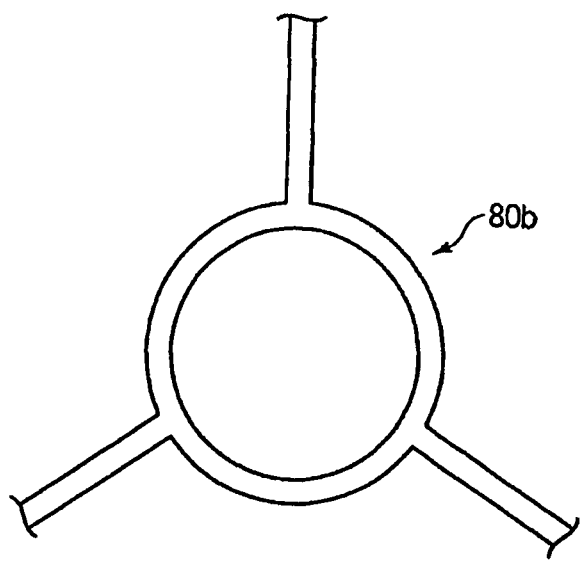
FIG. 15 is a view illustrating a modification of the loop portion.
Figure 16:
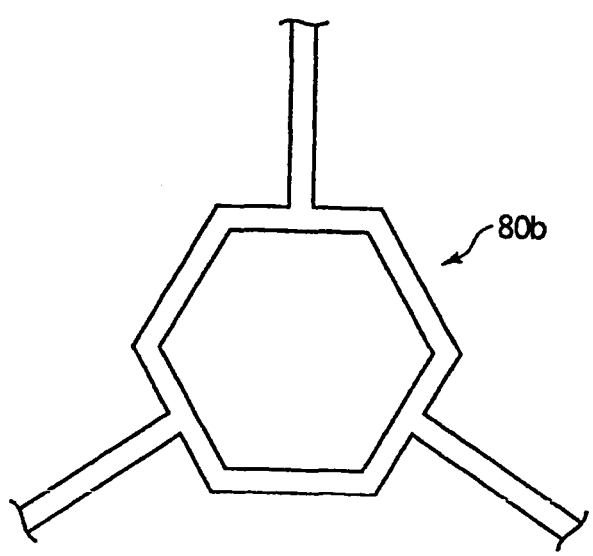
FIG. 16 is a view illustrating another modification of the loop portion.

Further, the shape of the loop portion 80b is not restricted to a triangle shape but it may be a circular ring shape as shown in FIG. 15, for example. Moreover, it may be a polygonal shape such as hexagon as shown in FIG. 16, for example.

Further, although the housing 70 forming a depressurized chamber is exemplified as a hexahedron having a rectangular shape when viewed from top in the embodiment of the present invention, the seal mechanism of the present invention may also be applied to a case of manufacturing an octahedral or decahedral depressurized chamber by joining plates, for example.

Further, the depressurized chamber is not limited to that having the housing 70 and the ceiling plate 71 as illustrated in FIG. 4. For example, in a depressurized chamber including lower and upper chambers disposed opposite to each other, the chamber is opened and closed by raising, lowering, sliding and rotating the upper chamber, the seal mechanism of the present invention can be also applied to the case of manufacturing the upper and lower chambers by joining plates.

Further, although the transfer chamber 20 is described as an example in the embodiment of the present invention, the technical idea of the present invention may be applied to any depressurized chamber without being limited thereto. For example, the seal mechanism may be employed to the load-lock chamber 30 as a preliminary vacuum chamber and the processing chambers 10a to 10c as vacuum processing chambers, for example.

The present invention can be appropriately utilized in manufacturing a depressurized chamber in which a glass substrate for FPD, for example, is transferred and undergone various processing such as etching.

While the invention has been shown and described with respect to the embodiments, it will be understood by those skilled in the art that various changes and modifications may be made without departing from the scope of the invention as defined in the following claims.

What is claimed is:

1. A seal member for internally sealing a depressurized chamber, comprising:
    a loop portion for sealing around one corner of the depressurized chamber, the loop portion being arranged to enclose said one corner of the depressurized chamber and pressed against internal walls of plates forming said one corner, and the loop portion including
    a first linear portion;
    a second linear portion; and
    a third linear portion,
    wherein the first linear portion, the second linear portion and the third linear portion form a triangle, and
    wherein the loop portion is fixed by:
    a support block held at said one corner of the depressurized chamber, the support block having a support surface to support the loop portion; and
    a corner pressing member joined to the plates forming said one corner of the depressurized chamber, the corner pressing member securing the loop portion between the support surface of the support block and the corner pressing member.

2. The seal member of claim 1, wherein the loop portion is arranged to form an obtuse angle with a joint line formed by the plates forming said one corner in a sealing state.

3. A seal member for internally sealing joints of a depressurized chamber constructed by joining a plurality of plates, comprising:
    a linear part for sealing a linear joint of the depressurized chamber; and
    a loop portion for sealing around a corner joint of the depressurized chamber, the loop portion adjoining the linear part to enclose the corner joint of the depressurized chamber and being pressed against internal walls of plates forming the corner, and the loop portion including
    a first linear portion;
    a second linear portion; and
    a third linear portion,
    wherein the first linear portion, the second linear portion and the third linear portion form a triangle, and
    wherein the loop portion is fixed by:
    a support block held at the corner joint of the depressurized chamber, the support block having a support surface to support the loop portion; and
    a corner pressing member joined to the plates forming the corner joint of the depressurized chamber, the corner pressing member securing the loop portion between the support surface of the support block and the corner pressing member.

4. The seal member of claim 3, wherein the linear part is connected to the loop portion adjacent to the corner of the depressurized chamber in a seal state.

5. The seal member of claim 4, wherein the loop portion is arranged to form an obtuse angle with the linear part in a seal state.

6. The seal member of claim 3, wherein the linear part and the loop portion are integrally connected to each other.

7. The seal member of claim 3, wherein the loop portion is arranged to form an obtuse angle with the linear joint in a sealing state.

8. A seal member for internally sealing joints of a depressurized chamber constructed by joining a plurality of plates, comprising;
- a linear part arranged along a first joint line formed by the plates, the linear part being bent at an obtuse angle adjacent to a corner of the depressurized chamber and connected by a loop portion with another linear part arranged along a second joint line at a position spaced apart from the corner, and the loop portion including
- a first linear portion;
- a second linear portion; and
- a third linear portion,
- wherein the first linear portion, the second linear portion and the third linear portion form a triangle, and
- wherein the loop portion is fixed by:
- a support block held at said corner of the depressurized chamber, the support block having a support surface to support the loop portion; and
- a corner pressing member joined to the plates forming said corner of the depressurized chamber, the corner pressing member securing the loop portion between the support surface of the support block and the corner pressing member.

9. The seal member of claim 8, wherein the linear part arranged along the first joint line is branched at the bent position into two parts which are connected to two linear parts arranged along other two joint lines converged into the corner, respectively.

10. The seal member of claim 9, wherein the branched parts are arranged to enclose the corner of the depressurized chamber and pressed against internal walls of plates forming the corner by an assistance mechanism.

11. A depressurized chamber constructed by joining a plurality of plates, having a seal mechanism to internally seal the depressurized chamber the seal mechanism comprising:
- a seal member having a linear portion for sealing a linear joint formed by the plates, and a loop portion being arranged adjacent to the linear portion to enclose a corner of the depressurized chamber for sealing around the corner of the depressurized chamber by being pressed against internal walls of plates forming the corner;
- a linear part pressing member for fixing the linear portion of the seal member;
- a support block held at the corner of the depressurized chamber, the support block having a support surface to support the loop portion of the seal member; and
- a corner pressing member joined to the plates forming the corner of the depressurized chamber, the loop portion being secured between the support surface of the support block and the corner pressing member.

12. The depressurized chamber of claim 11, wherein the support block has a protruded contact surface which comes in contact with the corner pressing member, the support surface being formed around the contact surface.

13. The depressurized chamber of claim 11, wherein the corner pressing member has a protruded contact surface which comes in contact with the support block, and a pressing surface for pressing the loop portion formed around the contact surface.

14. The depressurized chamber of claim 11, wherein the support block is fixed to the plates forming the corner.

15. The depressurized chamber of claim 11, wherein the corner pressing member is fixed to the plates forming the corner.

16. The depressurized chamber of claim 11, wherein the corner pressing member has a press surface for pressing the linear portion against the joint line formed by the plates forming the corner.

17. The depressurized chamber of claim 11, wherein the support block and the corner pressing member are connected and aligned with each other.

18. A vacuum processing apparatus comprising a depressurized chamber described in claim 11.

19. A seal mechanism of a depressurized chamber for internally sealing the depressurized chamber constructed by joining a plurality of plates, comprising:
- a seal member having a linear portion for sealing a linear joint formed by the plates, and a loop portion disposed adjacent to the linear portion, the loop portion being arranged to enclose a corner of the depressurized chamber and sealing around the corner of the depressurized chamber by being pressed against internal walls of the plates which form the corner;
- a linear part pressing member for fixing the linear portion of the seal member;
- a support block held at the corner of the depressurized chamber, the support block having a support surface to support the loop portion of the seal member; and
- a corner pressing member joined to the plates forming the corner of the depressurized chamber, the loop portion being fixed between the support surface of the support block and the corner pressing member.

* * * * *